US005107262A

United States Patent [19]

Cadoz et al.

[11] Patent Number: 5,107,262

[45] Date of Patent: Apr. 21, 1992

[54] MODULAR RETROACTIVE KEYBOARD AND A FLAT MODULAR ACTUATOR

[75] Inventors: Claude Cadoz, Saint Joseph de Riviere; Leszek Lisowski, Echirolles; Jean-Loup Florens, Grenoble, all of France

[73] Assignee: Ministere de la Culture, de la Communication, des Grands Travaux et du Bicentenaire, Paris, France

[21] Appl. No.: 420,242

[22] Filed: Oct. 12, 1989

[30] Foreign Application Priority Data

Oct. 13, 1988 [FR] France .............................. 88 14064

[51] Int. Cl.[5] ........................................ H03K 17/972

[52] U.S. Cl. ........................................ 341/22; 341/27; 341/32; 84/744; 84/745; 84/DIG. 7; 235/145 R

[58] Field of Search .............................. 341/27, 32, 22; 235/145 R; 84/DIG. 7, 423 R, 433, 744, 745, 719, 720, 644, 610

[56] References Cited

U.S. PATENT DOCUMENTS

| | | | |
|---|---|---|---|
| 3,499,515 | 3/1970 | Mikrut | 235/145 R |
| 3,627,896 | 12/1971 | Uemura | 84/745 |
| 3,631,472 | 12/1971 | Lincoln et al. | 235/145 R |
| 3,698,531 | 10/1972 | Bernin | 341/32 |
| 3,728,652 | 4/1973 | Nishikawa | 341/32 |
| 3,740,448 | 6/1973 | Olszowka et al. | 84/DIG. 7 |
| 4,359,613 | 11/1982 | Rooney | 235/145 R |
| 4,500,758 | 2/1985 | Gockenheimer | 341/27 |
| 4,580,478 | 4/1986 | Brosh et al. | 84/DIG. 7 |
| 4,892,024 | 1/1990 | Watanabe | 84/DIG. 7 |

FOREIGN PATENT DOCUMENTS 2583542 6/1985 France .

OTHER PUBLICATIONS

C. Cadoz, et al., "Responsive Input Devices and Sound Synthesis by Simulation of Instrumental Mechanisms: The Cordis System" Computer Music Journal, vol. 8, No. 3 (1984), pp. 60–73.

Jean-Loup Florens, et al., "International Computer Music Conference 1986", ICMC 86 Proceedings, pp. 65–70.

*Primary Examiner*—Donald J. Yusko
*Assistant Examiner*—Michael Horabik
*Attorney, Agent, or Firm*—Lowe, Price, LeBlanc & Becker

[57] ABSTRACT

A modular retroactive keyboard fitted with keys permitting to send back to the user a perception characteristic of the key. Each key is an element of an independent flat and parallelepipedic module that includes a motor, a position detector and an electric connector. Each module further includes arrangement for fixing it to the adjacent module, and the keys are connected to a central processing unit for giving them the desired response by acting on the motor and for processing the detector signals.

18 Claims, 5 Drawing Sheets

MODULAR RETROACTIVE KEYBOARD AND A FLAT MODULAR ACTUATOR

BACKGROUND OF THE INVENTION

The present invention relates to the field of keyboard electronic musical instruments and to the implementation of an assembly of flat modular actuators.

Numerous progresses have been made in electronic musical instruments as regards electronics itself and, from a music point of view, an apparatus can fulfil numerous functions thanks to the various programs that can be entered in a control processor. However, the mechanical part of the electronic apparatuses fitted with a keyboard still remains rather primitive. It lacks flexibility in various respects:

on the one hand, it is generally not possible to replace at a chosen place of the keyboard a type of key by another one (for example a piano key by a joy stick, a white key by a black key, etc.);

on the other hand, the set of keys constituting the keyboard is predetermined and the user cannot increase the number of keys unless he buys a new keyboard.

SUMMARY OF THE INVENTION

Thus, a first object of the invention is to provide a keyboard for an electronic musical apparatus offering more flexibility in manufacturing and utilization that the keyboards according to the prior art.

To achieve this purpose the invention provides for a modular keyboard.

Another object of the invention is to provide for such an apparatus wherein the keys are retroactive, that is, oppose to the user's action a feedback of a nature chosen according to the type of function that it is desired to impart to the key.

In order to obtain this feedback, each key module has to be associated with a motor unit. One of the preconceptions the invention had to overcome was the fact that the realization of a motor unit having an appropriate power and being flat enough to be held in the space allocated for example to a piano key, seemed to be an insurmountable task, from the technical and/or economical viewpoint. Indeed, if one considers a conventional piano octave (12 keys), it extends over 165 millimeters, that is, the width of the mechanical elements associated with each key must not exceed 13.75 millimeters. In order to achieve a fully modular system, it is desirable that each motor unit does not exceed this width. If this is not the case, it would be necessary to shift the motor units the one with respect to the other which would cause the system to be no longer fully modular.

Thus, another object of the invention is to provide for a specific flat linear motor that can be assembled in a modular way with other motors. This motor, or modular actuator, according to the invention is of course liable to fulfil other applications than those of a musical instrument keyboard, and is liable for example to be used in the field of robotics; in this respect, another object of the invention is to provide for means coupling different keys, thereby implementing complex motions and obtaining for example gripping means.

To achieve those objects and others the invention provides for a modular retroactive keyboard fitted with keys permitting to send back to the user a characteristic perception of said key, wherein each key is a component of an independent flat and parallelepipedic module comprising a motor, a position detector and electric connection means, each module comprising means for its fixing to the adjacent module, and the keys being connected to a processing central unit for giving them the desired response by acting on the motor and for processing the detector signals.

According to an embodiment of the invention, each module comprises a mobile plate or arm identical for all the keys, this plate comprising means for fixing thereto interchangeable fittings, the look, shape and size of which correspond to a given instrument, original or of conventional type.

According to another aspect of the invention, it provides for an assembly of flat modular actuator modules. Each module comprises: a flat mobile coil mounted on sliding rails that allow it to slide in its plane according to a determined direction, means for supplying current to the coil, on each side of this coil and substantially parallel to it a flat means for applying a magnetic field in a direction orthogonal to the coil plane, this field being in a first direction in a first half part of the surface occupied by the coil at rest and in the opposite direction in the second half part, and spacing means for maintaining a constant gap between the means for applying the magnetic field. In this assembly, only one means for applying the magnetic field is present between two coils, and closing means surround the extremity means for applying the magnetic field.

According to an embodiment of the invention, the means for applying the magnetic field are plate-shaped permanent magnets directed in an opposite direction in each half surface.

According to an embodiment of the invention, the means for applying the magnetic field are flat coils directed in an opposite direction in each half surface.

According to an embodiment of the invention, this assembly comprises identical supporting frames fitted with means for spacing them away from the adjacent frame, each frame comprising fixing means for carrying: means for applying the magnetic field, guiding rods for an adjacent flat and mobile coil, a position detector of said coil.

BRIEF DISCLOSURE OF THE DRAWINGS

The foregoing and other objects, features and advantages of the invention will be apparent from the following detailed description of preferred embodiments as illustrated in the accompanying drawings wherein.

Figure 3:
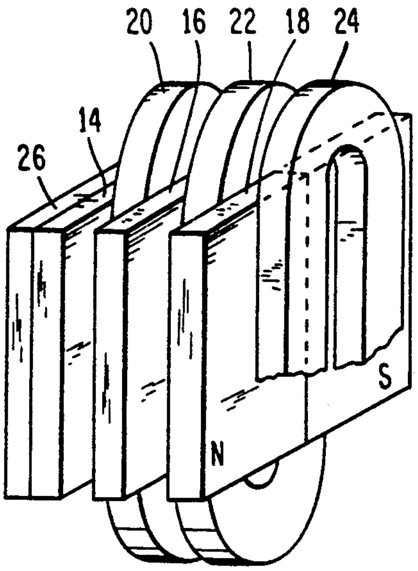
Figures 4A, 4B:
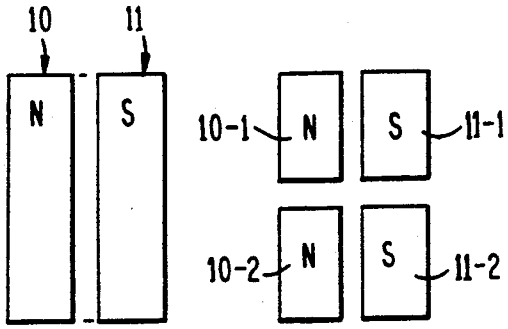
Figure 5:
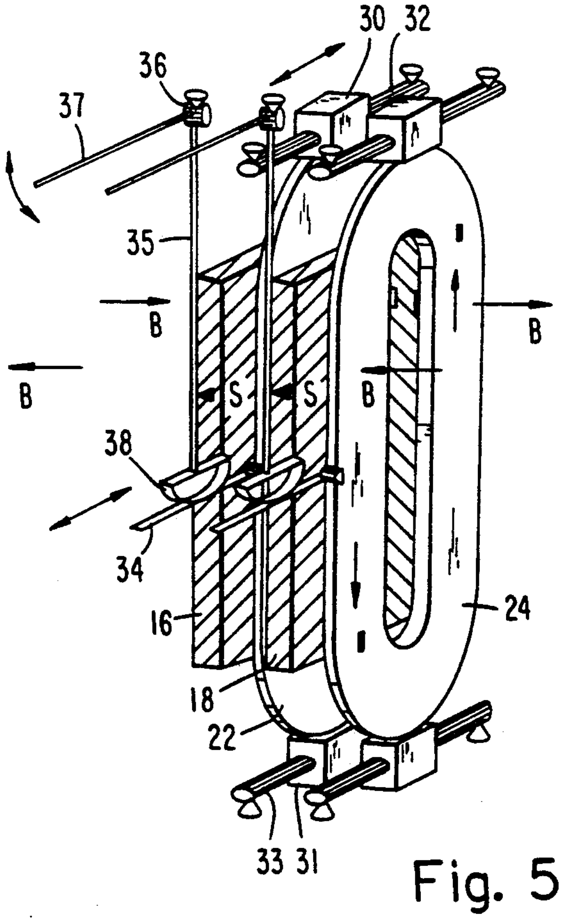
Figure 6:
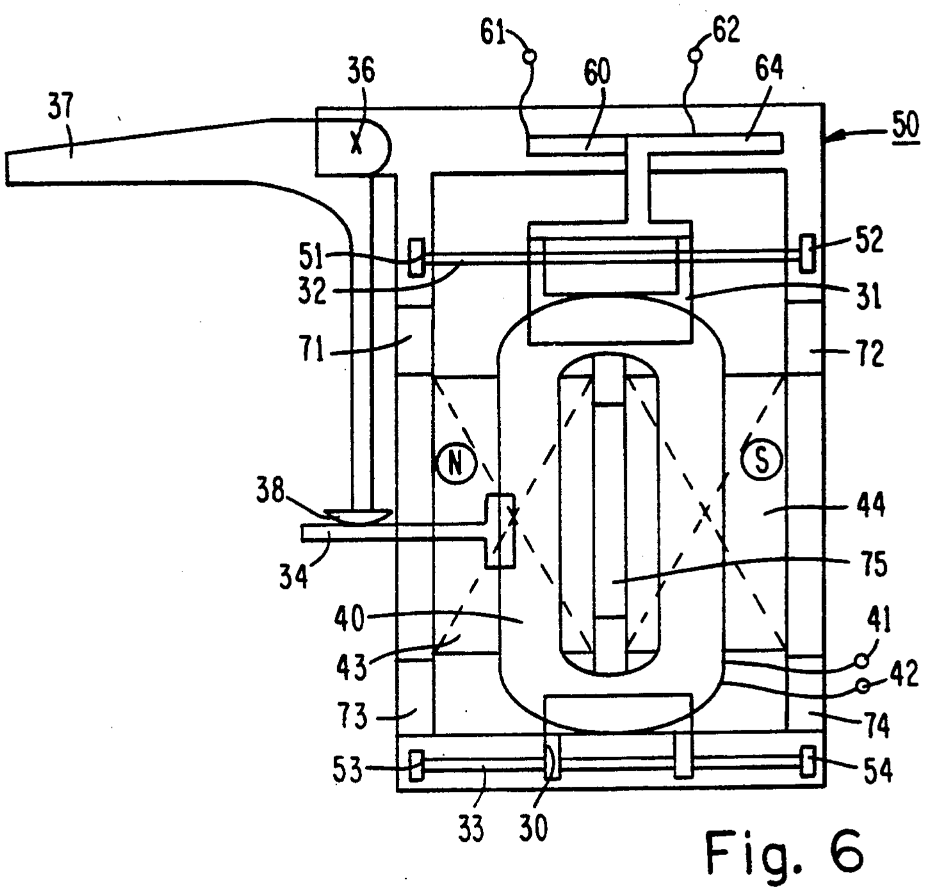
Figure 7:
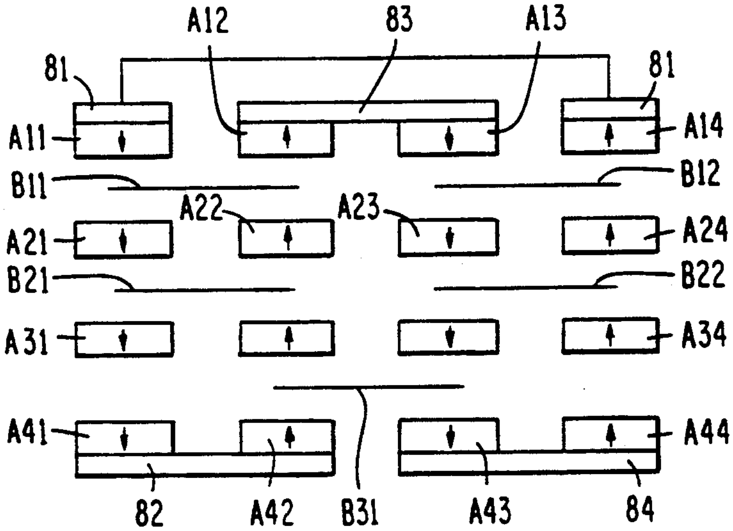
Figure 8:
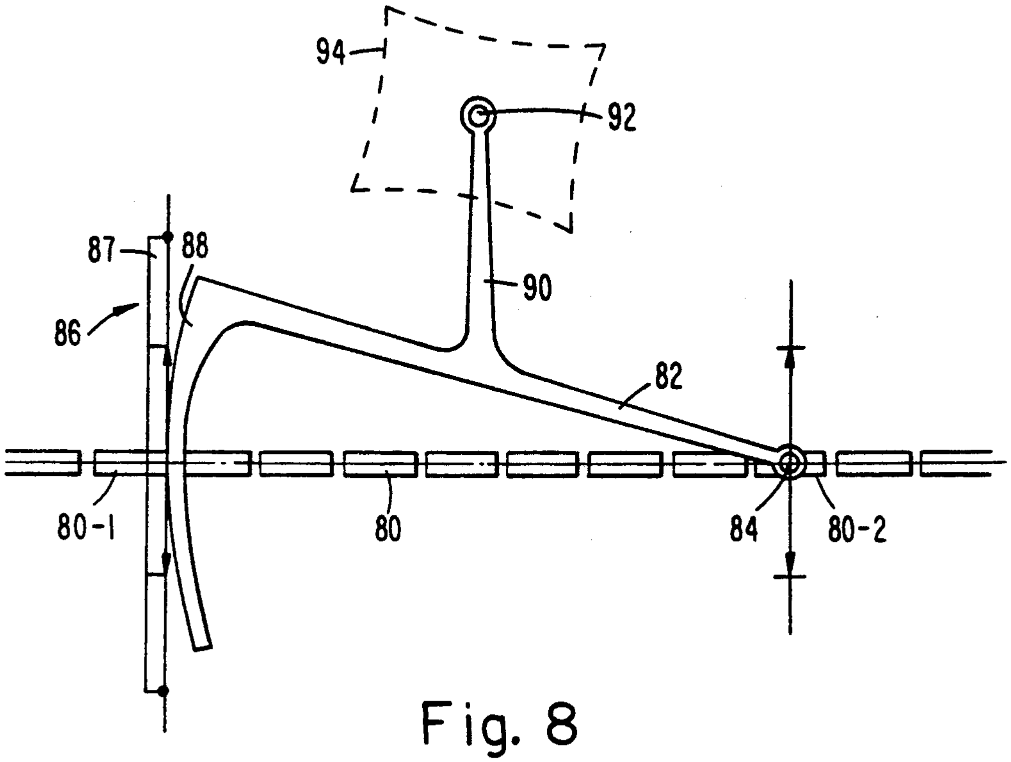

FIG. 3 very schematically shows a modular actuator according to the invention;

FIGS. 4A and 4B are top views of magnets included in a modular actuator according to the invention;

FIG. 5 is a simplified schematical and perspective view of two modules of an actuator according to the invention;

FIG. 6 is a front view of a modular actuator according to the invention;

FIG. 7 schematically illustrates a matrix assembly of modular actuators according to the invention;

FIG. 8 schematically shows means coupling two different keys; and

Figure 9:
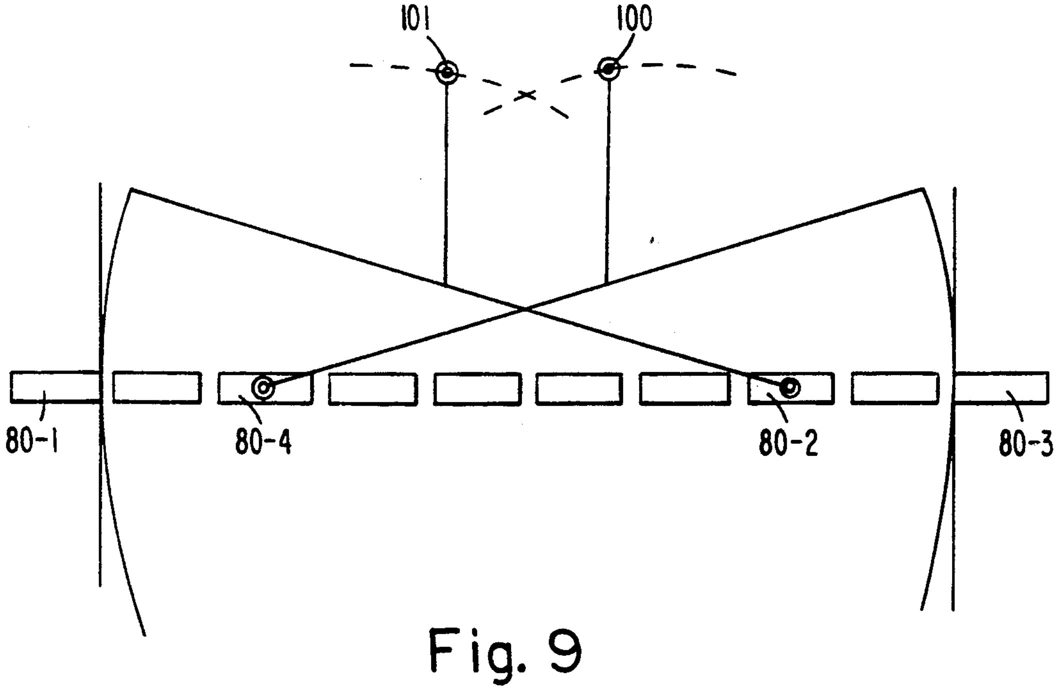

FIG. 9 schematically shows the association of two coupling means forming gripping means.

Figure 10:
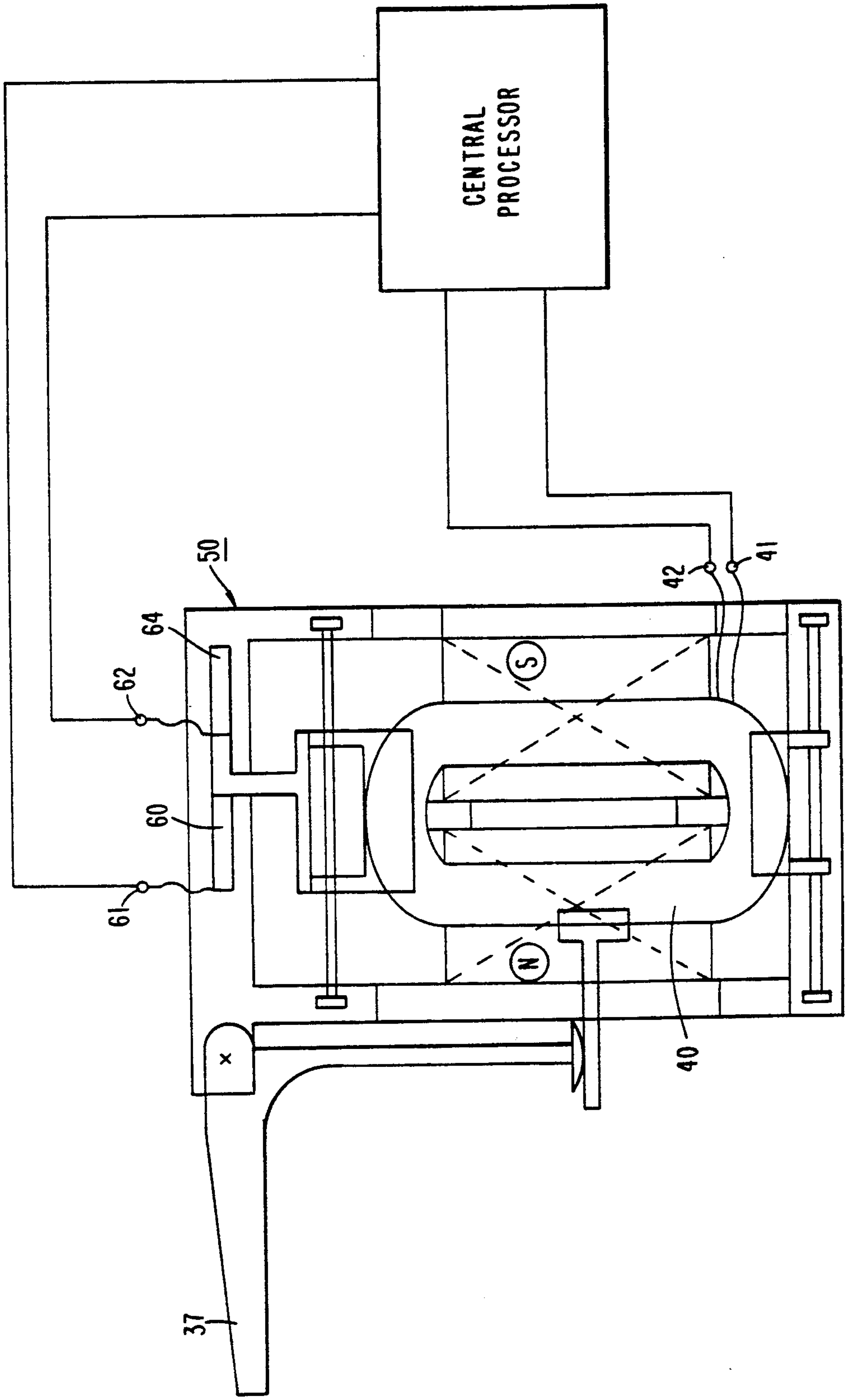

FIG. 10 is a front view of a modular activator shown schematically connected to a central processor.

DETAILED DESCRIPTION OF THE INVENTION

Figure 1:
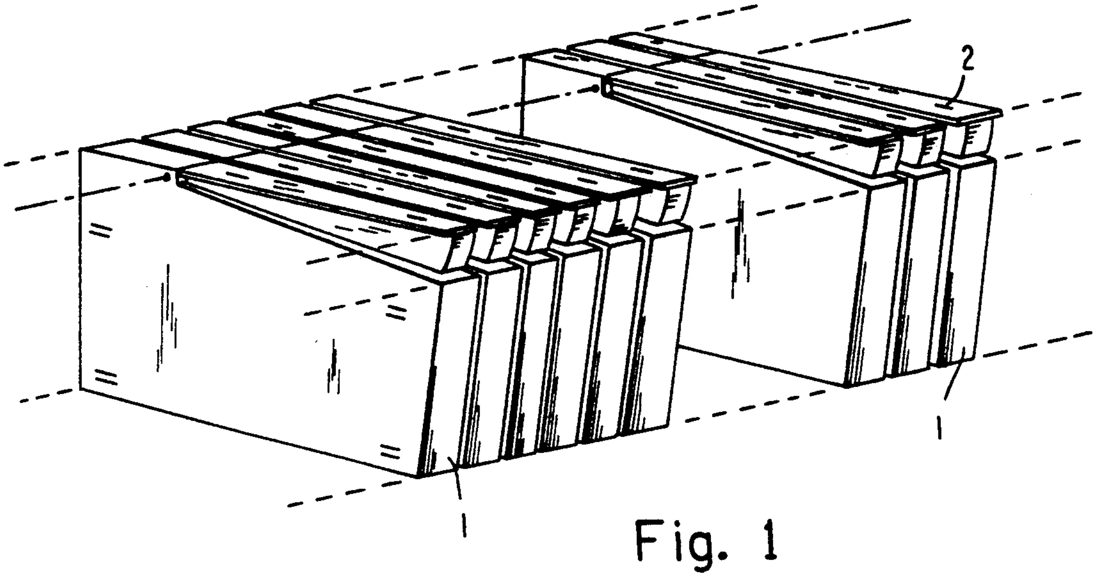
FIG. 1 shows a keyboard according to the invention made of modular keys.

FIG. 1 schematically shows the structure of a keyboard according to the invention. This keyboard comprises individual modules 1, each of which comprises an actuating arm or plate 2. Inside the module there are included:

a key position detector, a motor unit or acutator permitting, as a function of the action detected on the key, to supply a resistive force and possibly a return force determined by a central processor receiving from each key the position information and supplying an order to the motor.

Besides, to each module is associated an electronic card comprising means for preprocessing the detector signals and ampli-fying means of the control signals supplied back by the central processor.

According to a characteristic of the invention, those modules are liable to be interconnected in a simple way, for example by locking or fixing them by means of rods and clamping.

Figure 2:
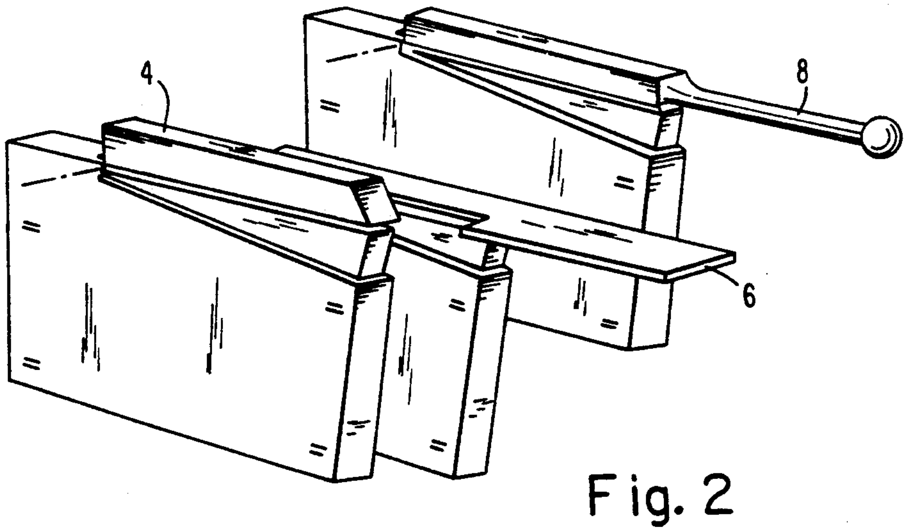
FIG. 2 illustrates the fact that it is possible to associate various functions to each key.

According to an aspect of the invention, as shown in FIG. 2, in case the keyboard is designed to form a keyboard for a musical instrument, the plates or arms 2 can be fitted with fittings looking like conventional keys of a musical instrument, for example a black key 4, a white key 6 or a joy stick 8.

Thus, the modular keyboard according to the invention offers the double advantage of comprising any number of keys but, moreover, each key can be associated with a different function provided the program associated in the central processor is properly modified for obtaining the reactions corresponding to this type of key. In addition, as explained hereinafter in connection with FIGS. 8 and 9, it is possible to couple a plurality of keys, for actuating same simultaneously in order to create, for example, a function analogous to a bow.

FIG. 3 is a very simple and schematical representation of a type of an appropriate motor for realizing modular actuators usable for example in a keyboard such as shown in FIG. 1. This motor comprises fixed flat-shaped means for generating a magnetic field, hereinafter called polarization elements, between which are arranged mobile coils tanslating in their plane. The mobile coils receive a current determined by a central processor.

Each polarization element is divided into two halves according to a vertical plane, as shown by FIGS. 4A and 4B, in order to apply in each of those two halves fields of opposite direction.

FIG. 4A shows the case where each polarization element comprises in its left part a magnetic plate 10, the north face of which is apparent, and in its right part a magnet plate 11, the south face of which is apparent.

As shown by FIG. 4B, for the sake of convenience and cost of the magnets, each plate could be divided into several elementary plates, for example 10-1 and 10-2 for the left part and 11-1 and 11-2 for the right part.

More particularly, FIG. 3 shows three plate-shaped polarization elements 14, 16 and 18 and three flat coils 20, 22 and 24. Moreover, on the left side of the polarization element 14 which is positioned at an extremity of a set of modules, is arranged a plate for closing the magnetic field 26, for example a soft iron plate. Thus, for example, for constituting an assembly of two modules according to the invention one will successively assemble a first closing plate 26, a polarization element 14, successive sets corresponding to each module comprising a mobile flat coil 20 and a stable polarization element 16, and then a second mobile coil 22 associated with its polarization element 18. In order to carry out a two-module set, instead of position a new coil 24 behind the polarization element 18 as is shown, a plate closing the field lines, similar to plate 26, will be placed behind this element 18.

The assembly in FIG. 3 shows that, except for the assembly extremities, in order to add a module to an existing set, it is only necessary to add a set comprising a polarization element and a coil.

Thus, as will be seen later on, the invention provides for elementary modules comprising, on a fixed frame equipped with means for connecting it with the adjacent frames, a support for the polarization elements and the mobile coil.

FIG. 5 is a perspective view slightly more detailed than that of FIG. 3 but still very schematic of a set of two polarization elements 16 and 18 and of two mobile coils 22 and 24. Each mobile coil is connected to sliding rails 30 and 31 liable to slide along guiding rods 32 and 33, those rods being, as will be seen later on, integral with a frame carrying a polarization element adjacent to the coil. Besides, on each coil is mounted a unit for transforming the movement of translation into a movement of rotation comprising a first arm 34 integral with the coil and moving in a forward-backward or backward-forward direction according to the direction of the current flowing in the coil, and a second arm 35 articulated on an axis 36 also integral with the fixed frame of the polarization element associated with the considered coil. The connection between the articulated arm 35 and the arm 34 carrying out a reciprocating movement is ensured by a conventional connection system schematically represented by a circular element 38. The arm 35 is rigidly connected with a third arm 37 which rotates with respect to the axis 36. This third arm 37 corresponds to the above-mentioned driving plate or arm of the considered module. The sizes of the various elements of the system transforming the movement of translation into a movement of rotation, in relation with the value of the possible movement of the coil along the guiding rods, will be for example chosen so as to be able to obtain a rotation of 10° with respect to a rest position. It is on the arms or plates 37 that is will be possible to clip or fix in another way the chosen fittings.

Of course, other means for transforming the movement of translation into a movement of rotation are usable and, for other applications, it will also be possible to directly use the movement of translation of the mobile coil.

FIG. 6 is a front view of an exemplary schematic realization of a coil and of a magnetization element mounted on a frame for forming an elementary module.

The coil is referenced 40 and its access terminals are referenced 41 and 42.

The polarization element comprises a plate 43, the north face of which is apparent, and a plate 44, the south face of which is apparent, in order to generate opposite fields in both vertical halves of the coil.

As in FIG. 5, this figure shows a system for transforming the movement of translation of the coil into a movement of rotation, designated by the same references 34–38.

The frame 50 has a substantially planar rear face and comprises means for lodging and blocking, for example forcibly, the magnetization plates 43 and 44. The frame comprises means 51, 52 and 53, 54 for fixing the guiding rods 32 and 33 on which the mobile coil 40 slides by means of sliding rails 30 and 31.

At the upper part of the frame a resistive stripe 60, the extremities of which are integral with the access terminals 61 and 62, is also shown. On this resistive stripe can slide a shorting wiper 64 integral with the sliding rail 31 so that the resistance between terminals 61 and 62 is representative of the mobile coil position.

On the other hand, protruding abutment pieces are provided for ensuring a determined gap with the rear face of the adjacent frame. Four lateral abutment pieces 71–74 and a central abutment piece 75 are shown. Preferably, the substantially planar rear face of frames 50 will include notches designed, in cooperation with abutment pieces 71–75, to position two successive frames one with respect to the other. Several frames are "sticked" spontaneously under the influence of the magnetic attraction. However, it will be more advisable to provide for passages for fixing rods or bolts.

As will be clear to those skilled in the art, in order that the set of actuator modules such as illustrated in FIGS. 3, 5 and 6 operates satisfactorily, it is necessary that the field generated by the mobile coil has no influence on the adjacent coil. This will be the case if the maximum field generated by a coil when a current flows therethrough does not exceed about one tenth of the field generated by the polarization elements.

Referring back to FIG. 3, it will be pointed out that a polarization element serves for the two coils that surround it. This permits to obtain a particularly compact and flat motor.

The above-mentioned requirements (13.75 millimeters in width for a piano keyboard) have been easily met with an experimental device according to the invention by using conventional elements comprising flat coils having a width of about 6 millimeters, those coils being lodged in a rectangle of 60×120 millimeters, and the polarization elements being constituted by rare earth magnet plates having a width of 6 millimeters, which allows an air gap on both sides of each coil lower than 1 millimeter (1.75/2 millimeter).

In the above, a line-shaped assembly of flat modular actuators has been discussed. Other assembly types are also possible.

FIG. 7 schematically shows an exemplary matrix assembly. This assembly is made of flat magnets Aij (as viewed from the extremity) arranged along four rows (i=1 . . . 4) and four columns (j=1 . . . 4). All the magnets of a column have the same magnetization direction (symbolized by an arrow) and the magnets of two adjacent columns have opposed magnetization directions. Coils B are arranged so as to receive, as previously, the field of the polarization elements grouping the magnets of the adjacent rows. However, it will be noted here that the concept of polarization element is not fixed as it is the case of the above described linear assemblies. As shown by the figure, while for coils B11, B12, B21, B22 the polarization elements correspond to magnets of columns 1 and 2 and of columns 3 and 4; on the contrary, for coil B31 the polarization elements group the magnets of columns 2 and 3. This increases the flexibility of the design and permits to have the arrangements of the actuators to be very dense and capable of fitting to specific needs.

FIG. 7 also schematically shows the closing plates 81–84 of the magnetic field, being understood that both plates 81 are connected by a magnetic path.

Of course, the invention is liable of various variants and modifications.

For example, the polarization elements instead of being made of permanent magnets could be iron-core flat coils fed with d.c. current, which constitutes an additional adjustment means for the actuators, permitting to apply a same condition by modifying the d.c. field of all the polarization elements.

On the other hand, in addition to the above described assemblies arranged according to linear row or matrix, other arrangements could be adopted. For example, the linear assembly could be, after a few minor variations of the shape, a ring-like assembly. It would therefore not be necessary to provide parts for closing the magnetic field. Similarly, the matrix assembly could be a concentric ring-like assembly.

On the other hand, the modular actuator according to the invention has been described in its application to a keyboard. In this case, the actuator mainly serves to supply a reaction force to an action on a key of the keyboard. Another application of this actuator would consist in having it actually act as a motor, for example as part of robot applications where it is often tried to group together a large number of actuators in a small space.

Among examples of other possible variants of the invention the following ones can be mentioned:

the mobile coils can include iron stripes arranged between the laps of the copper stripe wound up as a flat coil so as to optimize the consumption characteristic as a function of the power supplied;

various types of position detectors, potentiometric, optical, or inductive, for example, can be used;

the displacement of a coil can be used through a contactor connected to this coil and associated with a multipolar switch, for causing a determined sequential action of several coils of a given set;

two or several mobile coils of a same assembly can be mechanically and/or electrically coupled . . . .

Thus, according to a variant of the invention, it is possible to associate several keys in order to actuate, through a single control device, several keys of a keyboard or, conversely, to have the motors of several keys cause a movement with several degrees of freedom.

An exemplary association is schematically illustrated in FIG. 8. This figure shows, as viewed from the extremity, the extremities of keys 80, which correspond to the extremities of the arms or plates referenced 37 in FIGS. 5 and 6 and referenced 2 in FIG. 1. More specifically, two keys 80-1 and 80-2 are associated by an arm 82. An extremity of arm 82 is rotatively mounted on an axis 84 integral with key 80-2 and extending the latter perpendicularly to the plane of the figure. The other extremity of arm 82 is mounted on key 80-1 by a set 86 (analogous to set 38 of FIG. 5) for transforming a linear movement into a circular movement. This set 86 can include a plane 87 fixed on key 80-1 and oriented towards key 80-2. A ball 88 constituted by a cylinder portion around axis 84 lies on plane 87. Conventionally, plane 87 can be coupled to the cylinder portion 88 by a wire fixed to the upper and lower extremities of plane 87 and forming a loop around the cylinder portion, whereby a non-slipping and frictionless rolling movement of the cylinder portion 88 on plane 87 is obtained.

Considering a rod 90 fixed on the arm 82, its extremity 92 will be able to move in a plane inside an outline 94 for moving keys 80-1 and 80-2 or, on the contrary, for being moved by them. In case where it is the rod that actuates the keys, it can be used for simulating the behaviour of a joy stick with two degrees of freedom. It will also be noted that a two-degree of freedom movement can constitute a simplified representation of a violin bow.

FIG. 9 very schematically illustrates the association of two assemblies, of the type shown in FIG. 8, on the extremities of keys 80-1 and 80-2, on the one hand, and 80-3 and 80-4, on the other.

Of course, cut-out parts or curves will be provided in pieces of those assemblies in order that they do not come into contact. Reference 100 designates the rod extremity of the first assembly and reference 101 the rod extremity of the second assembly. It will be noted that it is possible to impart clipping movements to those rods which permits gripping of objects.

It will also be possible to obtain complex movements by mounting a shaft on the extremities 100 and 101 by means of balls and grooves.

On the other hand, those skilled in the art will note that other methods can be used for associating two keys, for example a telescopic arm articulated on each extremity of each key or two arms interconnected by an articulating device, each of which having an extremity articulated on one key. It will also be possible to provide associations of more than two keys.

FIG. 10 depicts a modular activator connected to a central processor. Terminals 61 and 62 supply a resistance value indicating the position of the mobile coil. In response to the resistive value, the central processor provides a control current to terminals 41 and 42 connected to coil 40, causing the coil to move vertically and thereby move plate 37.

We claim:

1. A modular retroactive keyboard having a plurality of keys for conveying to a user a tactile characteristic of said keys, wherein:
- each of said keys forming an element of an independent flat parallelepipedic module comprising a motor, a position detector and electric connection means;
- each module comprising means for attaching said each module to an adjacent one of said modules,
- the keys including means for connecting the keys to a central processing unit for controlling the motor of each of said modules and for providing a signal from each of said position detectors to said central processing unit.

2. A keyboard according to claim 1 wherein each module comprises a mobile plate or arm, identical for all the keys, said plate comprising means for fixing thereto interchangeable fittings having predetermined physical characteristics of a musical instrument.

3. An assembly of flat linear actuator modules, wherein each module comprises:
- a flat mobile coil mounted on sliding rails allowing the coil to slide in a plane parallel to a major surface of the coil in a determined direction;
- means for supplying direct current (D.C.) to the coil;
- electromagnetic means on opposite sides of, and substantially parallel to, said coil for applying a magnetic field in a direction orthogonal to a plane of the coil, said field being in a first direction in a first half of the surface occupied by the coil at rest and in an opposite direction in a second half of the surface occupied by the coil at rest; and
- spacing means for maintaining a constant gap between each of the means for applying a magnetic field, wherein:
- only one of said electromagnetic means for applying a magnetic field is present between adjacent ones of said coils; and
- closing means surround each of the electromagnetic means for applying a magnetic field.

4. An assembly of modules according to claim 3 wherein the means for applying a magnetic field are permanent magnets in the form of small plates oriented in opposite direction in each half of said surface.

5. An assembly of modules according to claim 3 wherein the means for applying a magnetic field comprises opposed flat coils in each half of said surface.

6. An assembly of flat linear actuator modules comprising:
- a plurality of said flat linear actuator modules, each module including
  - (i) a flat mobile coil mounted on sliding rails allowing the coil to slide in a plane parallel to a major surface of the coil in a determined direction,
  - (ii) means for supplying current to the coil,
  - (iii) electromagnetic means on opposite sides of, and substantially parallel to, said coil for applying a magnetic field in a direction orthogonal to a plane of the coil, said field being in a first direction in a first half of the surface occupied by the coil at rest and in an opposite direction in a second half of the surface occupied by the coil at rest, and
  - (iv) spacing means for maintaining a constant gap between each of the means for applying a magnetic field;
- a position detector associated with respective ones of said coils; and
- interfaces for controlling a signal applied to each of said coils in response to a signal supplied by said position detector, wherein:
- only one of said electromagnetic means for applying a magnetic field is present between adjacent ones of said coils; and
- closing means surround each of the electromagnetic means for applying a magnetic field.

7. An assembly of modules according to claim 6 comprising identical supporting frames fitted with means for spacing them away from adjacent frames, each frame comprising fixing means for carrying:
- means for applying a magnetic field,
- guiding rods for an adjacent flat and mobile coil, and
- a position detector for said coil.

8. An assembly of modules according to claim 6 comprising:
- a position detector associated with each respective coil;
- means for outputting a position signal from said position detector;
- means for receiving an externally applied control signal; and
- an interface for controlling a signal applied to each coil in response to said externally supplied control signal.

9. An assembly of modules according to claim 6 further comprising:

a central processor receiving a position signal from said position detector and supplying a feedback control signal to said interface for controlling said signal applied to each of said coils.

10. An assembly of flat linear actuator modules, wherein each module comprises:

a flat mobile coil mounted on sliding rails allowing the coil to slide in a plane parallel to a major surface of the coil in a determined direction;

means for supplying current to the coil;

electromagnetic means on opposite sides of, and substantially parallel to, said coil for applying a magnetic field in a direction orthogonal to a plane of the coil, said field being in a first direction in a first half of the surface occupied by the coil at rest and in an opposite direction in a second half of the surface occupied by the coil at rest; and spacing means for maintaining a constant gap between each of the means for applying a magnetic field, wherein:

only one of said electromagnetic means for applying a magnetic field is present between adjacent ones of said coils;

closing means surround each of the electromagnetic means for applying a magnetic field;

each module is integral with a key and two keys are coupled by an arm, articulated on each key and capable of being moved by one, the other or both.

11. A modular retroactive keyboard including a plurality of flat parallelepipedic modules each comprising:

a key;

a motor operatively connected for positioning said key;

a position detector providing a key position signal indicating a position of said key;

electric connection means for supplying a positioned signal to said motor and for supplying said key positioning signal to an external device; and attachment means for attaching said module to an adjacent one of said modules.

12. A keyboard according to claim 11 wherein said modules each comprise substantially identical mobile plates or arms including means for affixing thereto interchangeable fittings having predetermined physical characteristics of a musical instrument.

13. An assembly of a plurality of adjacent flat linear actuator modules, each of said modules comprising:

a flat mobile coil mounted on sliding rails allowing the coil to slide in a plane parallel to a major surface of the coil in a determined direction;

means for supplying direct current to the coil;

electromagnetic means adjacent and substantially parallel to said coil for applying a magnetic field in a direction orthogonal to a plane of the coil, said field being in a first direction in a first half of a surface area occupied by the coil at rest and in an opposite direction in a second half of the surface area occupied by the coil at rest;

spacing means for maintaining a constant gap between each of the means for applying a magnetic field; and closing means surrounding each of the electromagnetic means for applying a magnetic field;

wherein, in said assembly, a single one of said electromagnetic means is positioned between adjacent ones of said coils of respective ones of said adjacent modules.

14. An assembly of modules according to claim 13 wherein the means for applying a magnetic field are permanent magnets in the form of small plates oriented in opposite direction in each half surface.

15. An assembly of modules according to claim 13 wherein the means for applying a magnetic field are opposed flat coils in each of each half surface areas.

16. An assembly of flat linear actuator modules each of said modules comprising:

a flat mobile coil mounted on sliding rails allowing the coil to slide in a plane parallel to a major surface of the coil in a determined direction;

means for supplying a current to the coil;

electromagnetic means adjacent and substantially parallel to said coil for applying a magnetic field in a direction orthogonal to a plane of the coil, said field being in a first direction in a first half of a surface area occupied by the coil at rest and in an opposite direction in a second half of the surface area occupied by the coil at rest;

spacing means for maintaining a constant gap between each of the means for applying a magnetic field;

closing means surrounding each of the electromagnetic means for applying a magnetic field; and a position detector wherein, in said assembly, a single one of said electromagnetic means is positioned between adjacent ones of said coils of respective ones of said adjacent modules, and wherein said assembly includes an interface for controlling a signal applied to a respective one of said coils in response to a signal supplied by a respective one of said position detectors.

17. An assembly of modules according to claim 16, each of said modules further comprising:

a position detector associated with a respective coil;

means for outputting a position signal from said position detector;

means for receiving an externally applied control signal; and an interface for controlling a signal applied to said respective coil in response to said externally supplied control signal.

18. An assembly of modules according to claim 16 further comprising:

a central processor receiving a position signal from said position detector and supplying a feedback control signal to said interface for controlling said signal applied to each of said coils.

* * * * *